United States Patent
Chen et al.

(10) Patent No.: US 7,229,896 B2
(45) Date of Patent: Jun. 12, 2007

(54) STI PROCESS FOR ELIMINATING SILICON NITRIDE LINER INDUCED DEFECTS

(75) Inventors: Ming-Te Chen, Tai-Chung Hsien (TW); Yi-Ching Wu, Kao-Hsiung Hsien (TW); Chien-Tung Huang, Taipei (TW)

(73) Assignee: United Microelectronics Corp., Hsin-Chu (TW)

( * ) Notice: Subject to any disclaimer, the term of this patent is extended or adjusted under 35 U.S.C. 154(b) by 85 days.

(21) Appl. No.: 11/161,427

(22) Filed: Aug. 3, 2005

(65) Prior Publication Data

US 2007/0032039 A1    Feb. 8, 2007

(51) Int. Cl.
*H01L 21/762* (2006.01)

(52) U.S. Cl. .................. 438/435; 438/763; 438/792; 257/E21.546

(58) Field of Classification Search ............... 438/424, 438/435, 763, 792; 257/510, 506, E21.546
See application file for complete search history.

(56) References Cited

U.S. PATENT DOCUMENTS

| | | | |
|---|---|---|---|
| 5,447,884 A | | 9/1995 | Fahey et al. |
| 5,726,090 A | * | 3/1998 | Jang et al. ............... 438/435 |
| 5,731,241 A | * | 3/1998 | Jang et al. ............... 438/424 |
| 5,811,347 A | * | 9/1998 | Gardner et al. .......... 438/435 |
| 6,001,706 A | * | 12/1999 | Tan et al. ................ 438/424 |
| 6,100,163 A | * | 8/2000 | Jang et al. ............... 438/437 |
| 6,165,869 A | * | 12/2000 | Qian et al. .............. 438/424 |
| 6,165,906 A | * | 12/2000 | Bandyopadhyay et al. . 438/700 |
| 6,184,106 B1 | * | 2/2001 | Chung .................... 438/425 |
| 6,368,940 B1 | * | 4/2002 | Amon et al. ............. 438/424 |
| 6,432,798 B1 | * | 8/2002 | Liu et al. ................ 438/433 |
| 6,436,611 B1 | * | 8/2002 | Lee ........................ 430/314 |
| 6,479,367 B2 | * | 11/2002 | Park ........................ 438/424 |
| 6,486,039 B2 | * | 11/2002 | Yoo et al. ................ 438/425 |
| 6,677,634 B2 | * | 1/2004 | Hwang et al. ........... 257/301 |
| 6,709,931 B2 | * | 3/2004 | Kim ........................ 438/275 |
| 2001/0041421 A1 | * | 11/2001 | Park et al. ............... 438/424 |
| 2003/0143854 A1 | * | 7/2003 | Chen et al. .............. 438/700 |
| 2006/0003546 A1 | * | 1/2006 | Klipp et al. ............. 438/431 |

\* cited by examiner

*Primary Examiner*—M. Wilczewski
(74) *Attorney, Agent, or Firm*—Winston Hsu

(57) ABSTRACT

The present invention discloses an improved shallow trench isolation process. A semiconductor substrate having a pad oxide disposed thereon and a pad nitride disposed directly on the pad oxide is provided. A trench is etched, through the pad oxide and the pad nitride, into the semiconductor substrate. A thermal oxide liner is then grown in the trench. A silicon nitride liner is deposited into the trench, wherein the silicon nitride liner covering the pad nitride and the thermal oxide liner has a first stress status. A stress alteration process is performed to alter the silicon nitride liner from the first stress status to a second stress status. A trench fill dielectric having the second stress status is deposited into the trench.

10 Claims, 8 Drawing Sheets

STI PROCESS FOR ELIMINATING SILICON NITRIDE LINER INDUCED DEFECTS

BACKGROUND OF THE INVENTION

1. Field of the Invention

The present invention relates generally to the field of semiconductor fabrication and, more particularly, to an improved shallow trench isolation (STI) process to eliminate silicon nitride liner induced defects.

2. Description of the Prior Art

In the fabrication of semiconductor devices, isolation structures such as shallow trench isolation (STI) are formed between active areas in which electrical devices such as transistors or memory cells are to be formed. The isolation structures are formed in an early stage of the processing of a semiconductor substrate, typically prior to the formation of the transistors.

To form the STI structure, a pad oxide layer and a pad nitride layer are typically formed over the substrate surface and patterned to expose only the isolation regions, with the prospective active device regions covered. The pad nitride layer acts as a hard mask during subsequent processing steps, and the pad oxide layer functions to relieve stress between the underlying silicon substrate and the pad nitride layer.

A dry etch is then performed to form a trench through the nitride, pad oxide, and substrate. Dielectric material such as high-density plasma chemical vapor deposition (HDPCVD) oxide is then deposited to fill the trench. Thereafter, the excess dielectric material is polished away using a chemical mechanical polishing (CMP) process and the pad nitride layer is removed.

Many attempts have been made to improve the insulating quality of the STI regions formed on a semiconductor substrate. A silicon nitride liner has proven to be an effective oxygen diffusion barrier. The silicon nitride liner limits the amount of oxide that can be grown in deep trenches of DRAM arrays as well as in shallow trench structures, and as such, all but eliminates silicon crystal defects from forming within the trench capacitor array.

For example, U.S. Pat. No. 5,447,884 to Fahey, et al. discloses a process of forming shallow trench isolation with a nitride liner layer for devices in integrated circuits to solve a problem of recessing the nitride liner that led to unacceptable voids in the trench filler material by using a liner thickness of less than 5 nm.

Recent studies indicate that void defects are readily formed across the wafer at the interface between the nitride liner and the subsequently deposited trench fill layer. The void defects adversely affect the subsequent process, resulting in decreased production yield. Hitherto, there is no prior art proposing an effective solution to eliminate such problem arose from the use of a silicon nitride liner.

SUMMARY OF THE INVENTION

It is therefore the primary object of the present invention to provide an improved STI process to eliminate the above-described silicon nitride liner induced void defects.

The above and other objects and advantages, which will be apparent to one of skill in the art, are achieved in the present invention, which is directed to, in one aspect, a method of forming isolations in a semiconductor body to eliminate silicon nitride liner induced defects, comprising the steps of:

(a) providing a semiconductor substrate having a layer of pad oxide disposed thereon and a layer of pad nitride disposed directly on the pad oxide;

(b) etching at least one trench through the pad oxide and the pad nitride into the semiconductor substrate;

(c) growing a thermal oxide liner in the trench;

(d) depositing a silicon nitride liner into the trench, wherein the silicon nitride liner covering the pad nitride and the thermal oxide liner has a first stress status;

(e) performing a stress alteration process to alter the silicon nitride liner from the first stress status to a second stress status; and (f) depositing a trench fill dielectric having the second stress status into the trench.

These and other objectives of the present invention will no doubt become obvious to those of ordinary skill in the art after reading the following detailed description of the preferred embodiment that is illustrated in the various figures and drawings.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention. In the drawings.

DETAILED DESCRIPTION

Figure 1:
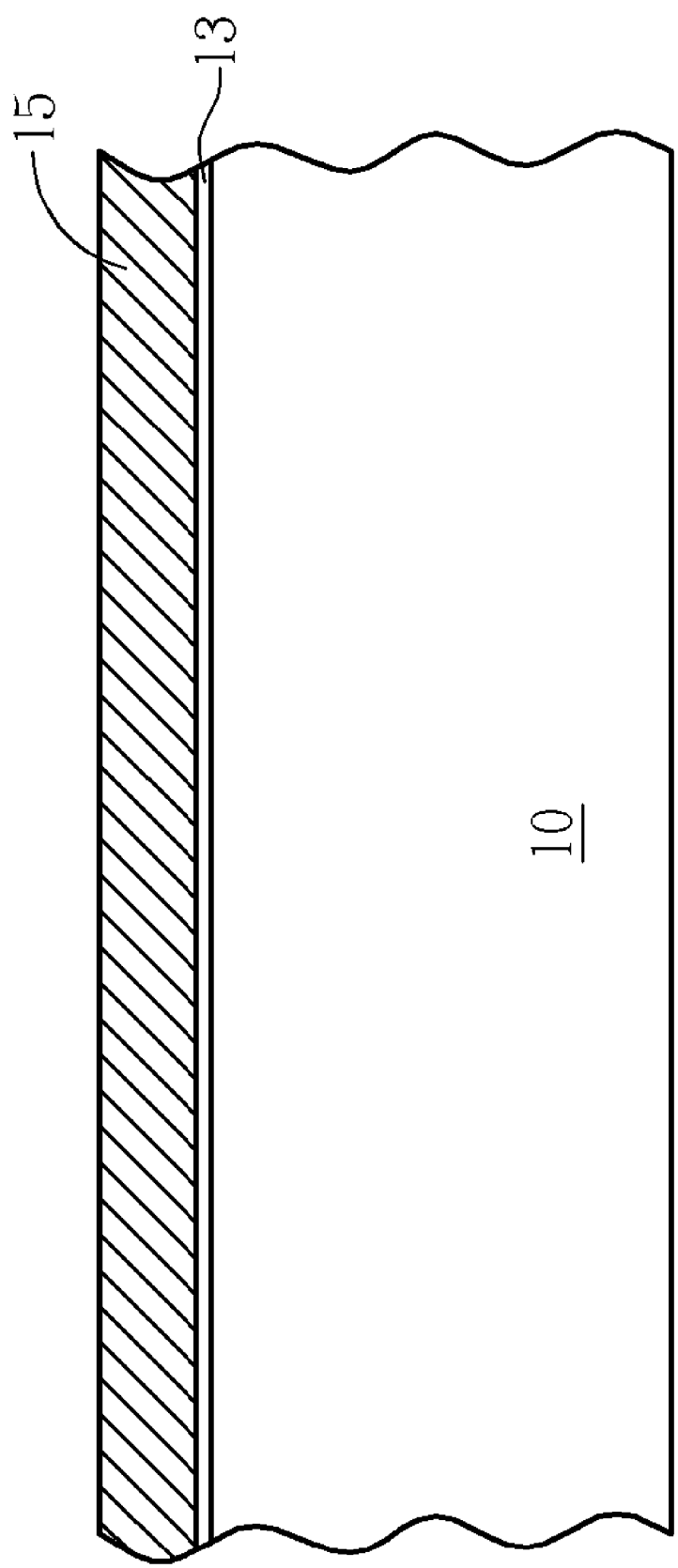
FIG. 1 is a partial vertical cross-sectional view of a semiconductor wafer having a pad oxide layer and a pad nitride layer thereon.

In describing the preferred embodiment of the present invention, reference will be made herein to FIGS. 1-8 of the drawings. Features of the invention are not drawn to scale in the drawings.

FIGS. 1 to 8 are schematic, cross-sectional diagrams showing one preferred embodiment of the present invention. As shown in FIG. 1, a semiconductor substrate 10 has a pad oxide layer 13, preferably silicon oxide, and a pad nitride layer 15, preferably silicon nitride.

Figure 2:
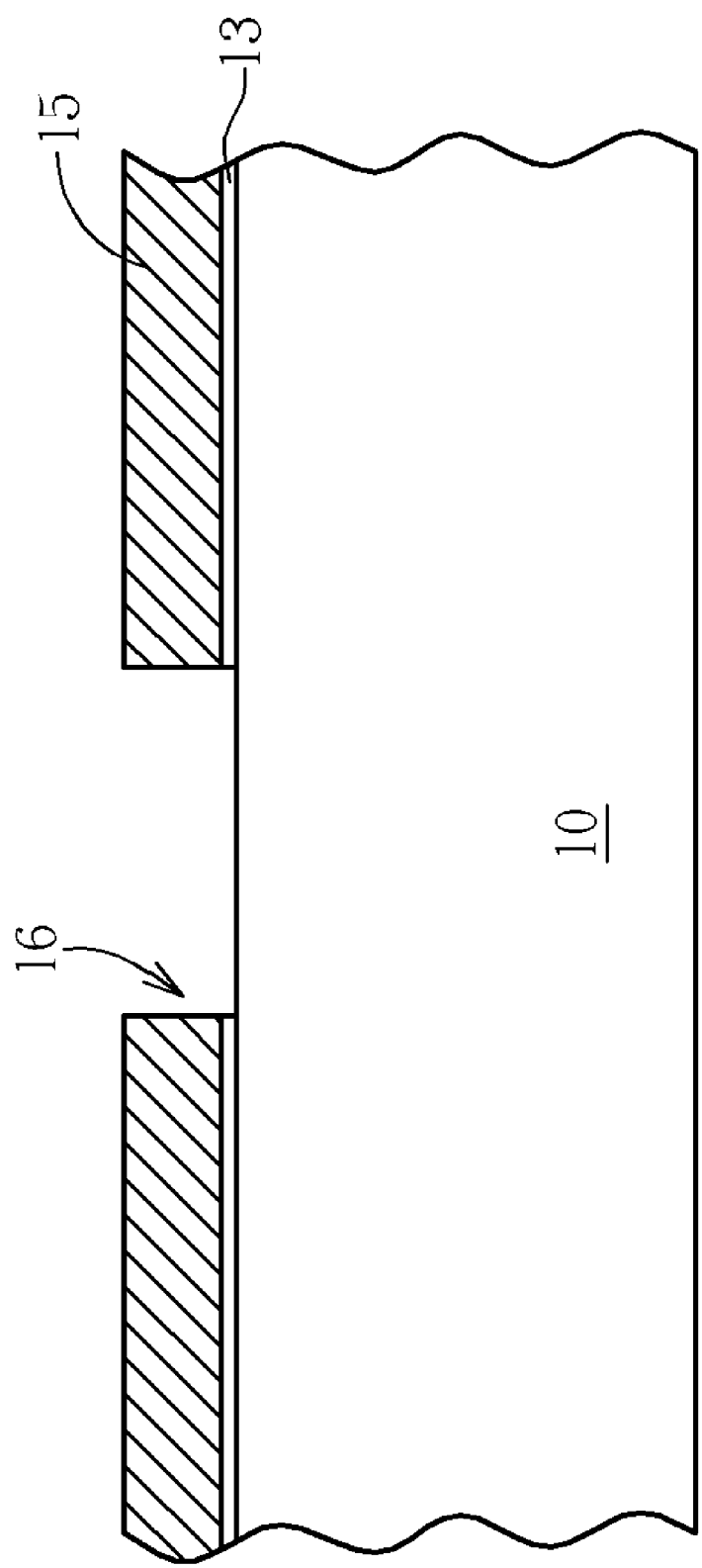
FIG. 2 is a partial vertical cross-sectional view of a semiconductor wafer having an aperture etched into the pad oxide layer and a pad nitride layer.

As shown in FIG. 2, the pad nitride layer 15 and pad oxide layer 13 are patterned and etched according to know processes in the art, preferably a dry etch process, to form an aperture 16 that exposes a pre-selected STI area to be etched into the substrate 10.

Figure 3:
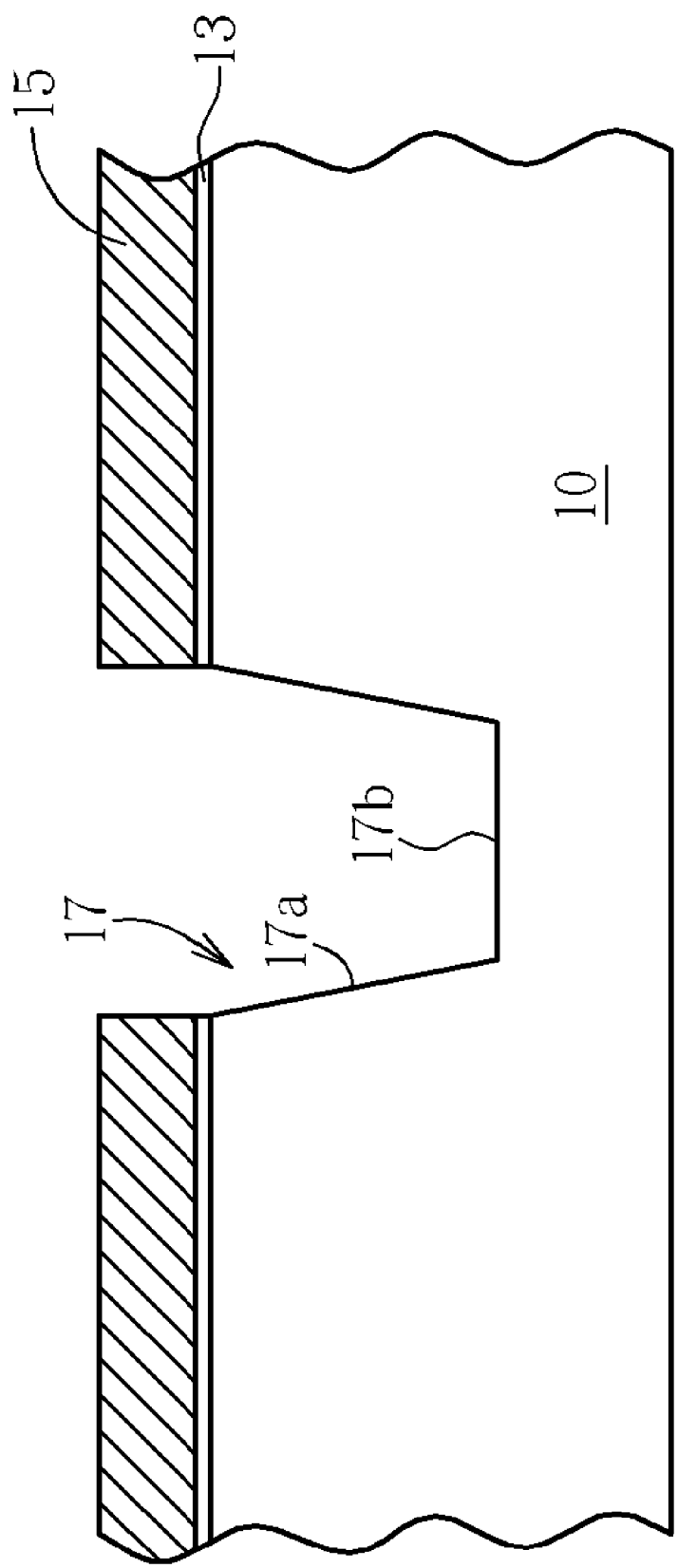
FIG. 3 is a partial vertical cross-sectional view of a semiconductor wafer having a shallow trench etched into the substrate.

As shown in FIG. 3, using the pad nitride layer 15 as a hard mask, another dry etching process is carried out to etch the exposed substrate 10 through the aperture 16, thereby forming a shallow trench 17. The depth of the shallow trench 17 ranges between 2000 angstroms and 4500 angstroms. The formed shallow trench 17 preferably has slightly oblique, tapered sidewalls 17a and a flat bottom 17b. After the trench etching process, the isolation trench may be wet cleaned using cleaning solutions known in the art.

Figure 4:
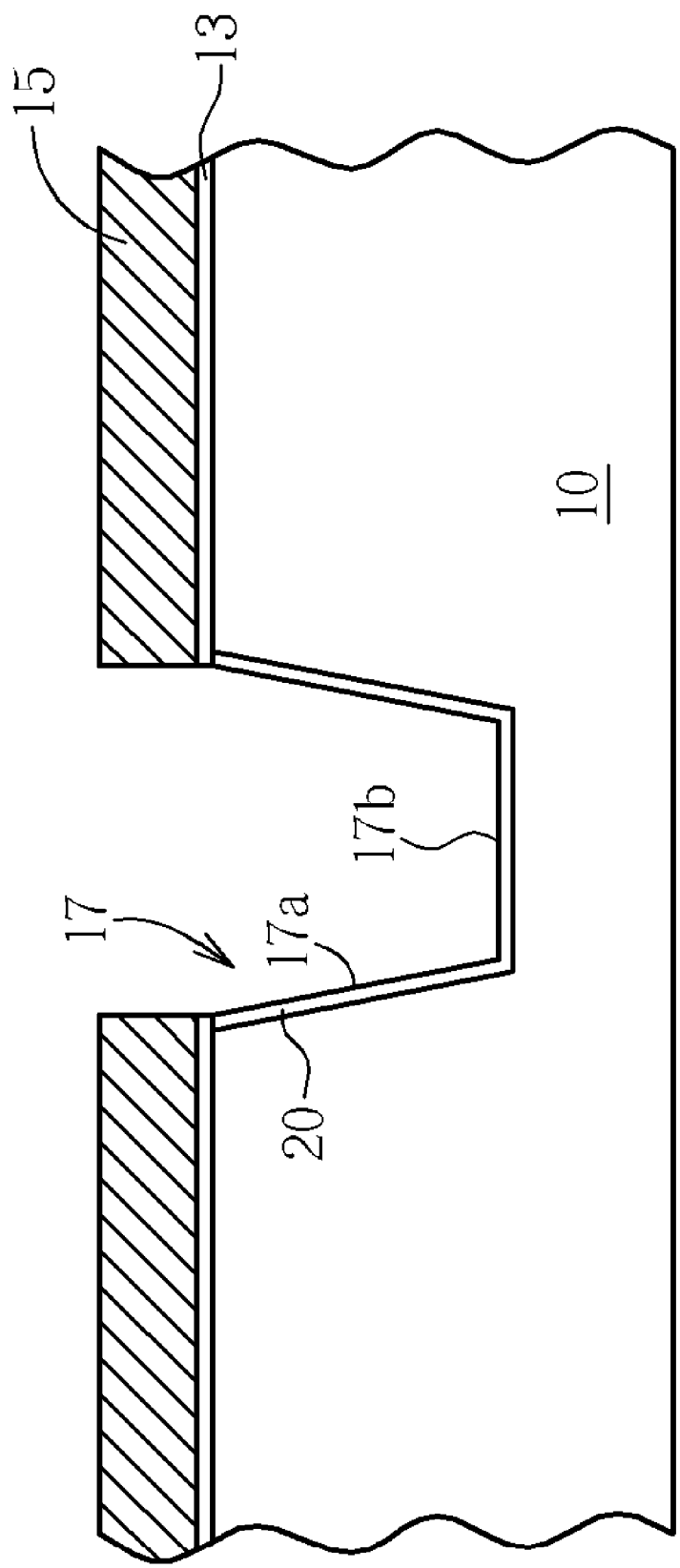
FIG. 4 is a partial vertical cross-sectional view of a semiconductor wafer having a thermal oxide layer grown on bottom and sidewalls of the shallow trench.

As shown in FIG. 4, a thermal oxide liner 20 is grown using a high temperature oxidation process at about 1000° C. for a period of about 3–10 minutes. Preferably, the thermal oxide liner has a thickness of about 50–200 angstroms.

Figure 5:
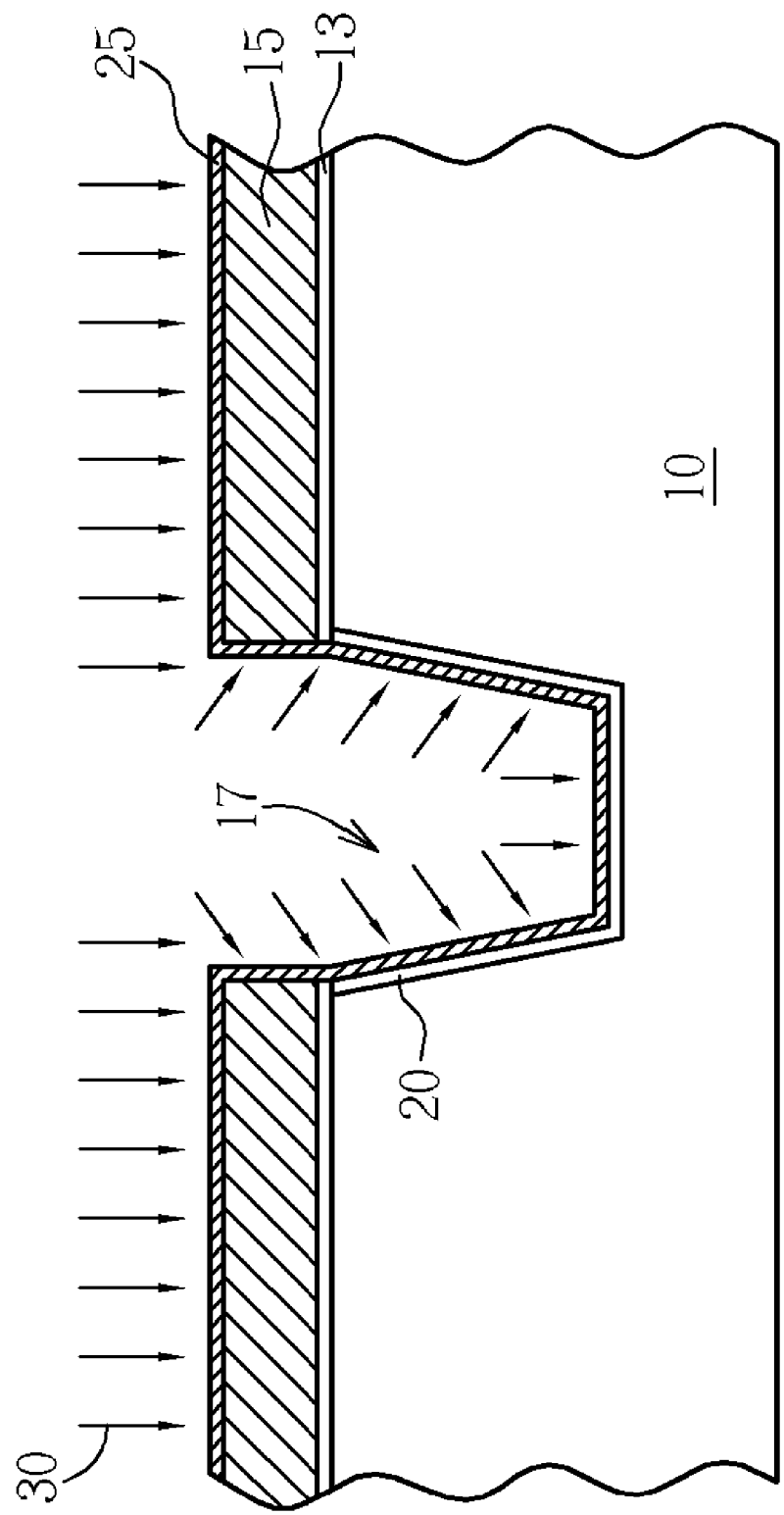
FIG. 5 is a partial vertical cross-sectional view of a semiconductor wafer having a silicon nitride liner deposited on pad nitride layer and in the shallow trench, wherein the silicon nitride liner is plasma treated to change its stress status.

As shown in FIG. 5, a silicon nitride liner 25 preferably having a thickness of about 20–100 angstroms is then deposited over the semiconductor substrate 10 and within the shallow trench 17. The silicon nitride liner 25 conformably covers the pad nitride layer 15 and the thermal oxide liner 20. The silicon nitride liner 25 may be deposited using any suitable chemical vapor deposition (CVD) methods known in the art such as low-pressure chemical vapor deposition (LPCVD). The silicon nitride liner 25 is a stressed film, for example, tensile-stressed. It is believed that the void defects that occur as in the prior art are induced due to the difference between the stress status of the silicon nitride liner 25 (tensile-stressed) and the stress status of the following HDPCVD oxide trench fill (compressive-stressed).

To eliminate the aforesaid stress difference between the silicon nitride liner 25 and the following HDPCVD oxide trench fill, after the deposition of the silicon nitride liner 25, a stress alteration treatment 30 is carried out to alter the stress condition of the silicon nitride liner 25 from tensile status to compressive status. According to the preferred embodiment of the present invention, the aforesaid stress alteration treatment 30 is preferably a plasma treatment such as $H_2$ plasma, $O_2$ plasma, $N_2$ plasma, He plasma, $CO_2$ plasma or the like.

It is understood that the stress alteration treatment 30 may include other non-plasma treatment. For example, the stress alteration treatment 30 may be an ion implant process utilizing dopants that are not III- or V-groups. In such case, the dopant energy and dosage of the ion implant process are tailored to an extent that is sufficient to change the stress status of the silicon nitride liner 25. In still another case, the stress alteration treatment 30 may be a furnace anneal process that is performed at a temperature larger than 800° C.

Figure 6:
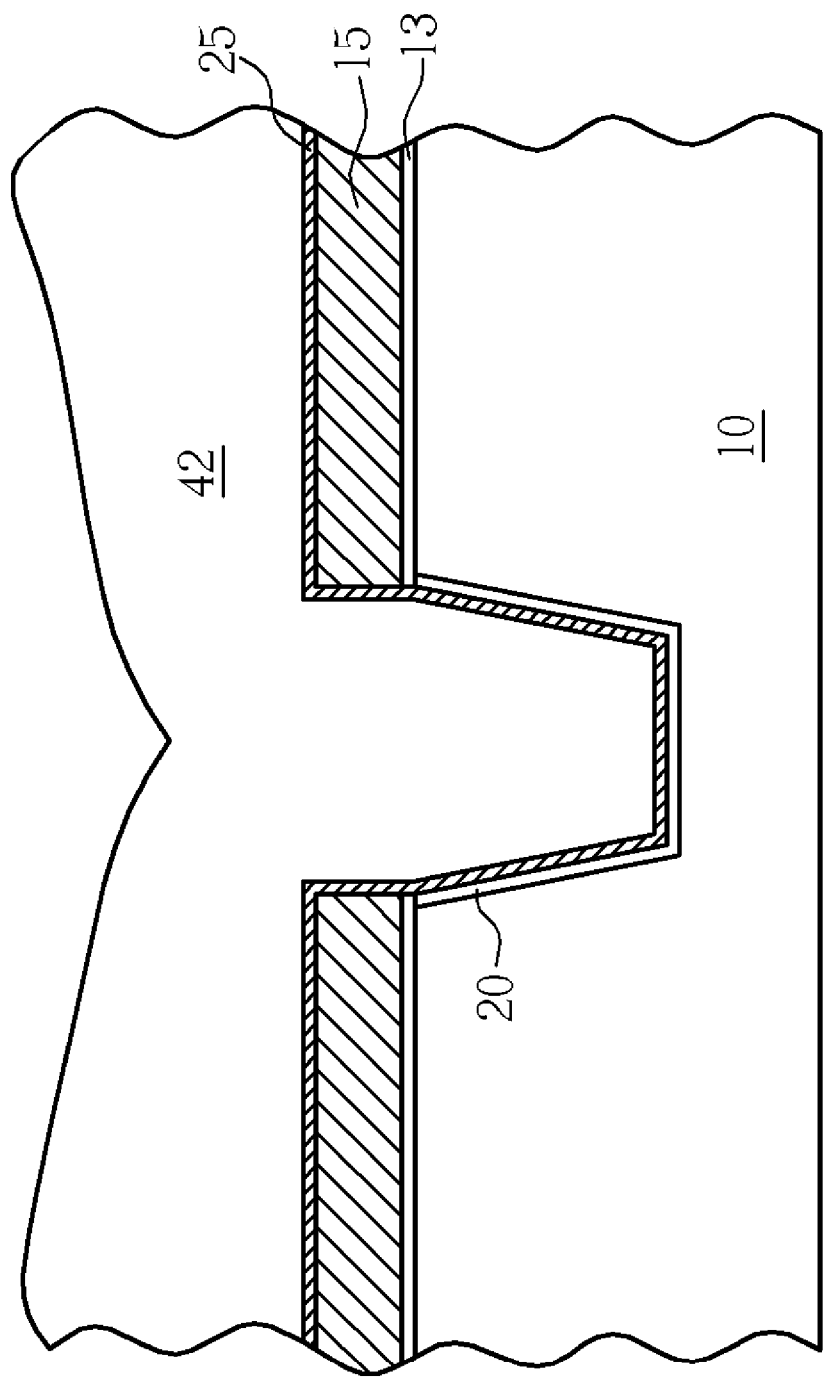
FIG. 6 is a partial vertical cross-sectional view of a semiconductor wafer having the trench filled with HDPCVD oxide.

As shown in FIG. 6, a compressive-stressed trench fill dielectric 42 is deposited to fill the trench 17 and covers the plasma-treated silicon nitride liner 25. According to the preferred embodiment, the trench fill dielectric 42 is HDPCVD oxide, which can be deposited in a commercial available HDPCVD tool by using precursors including silane and nitrous oxide ($N_2O$). In other cases, the trench fill dielectric 42 may be deposited by atmospheric pressure chemical vapor deposition (APCVD) or subatmospheric CVD (SACVD) methods.

Figure 7:
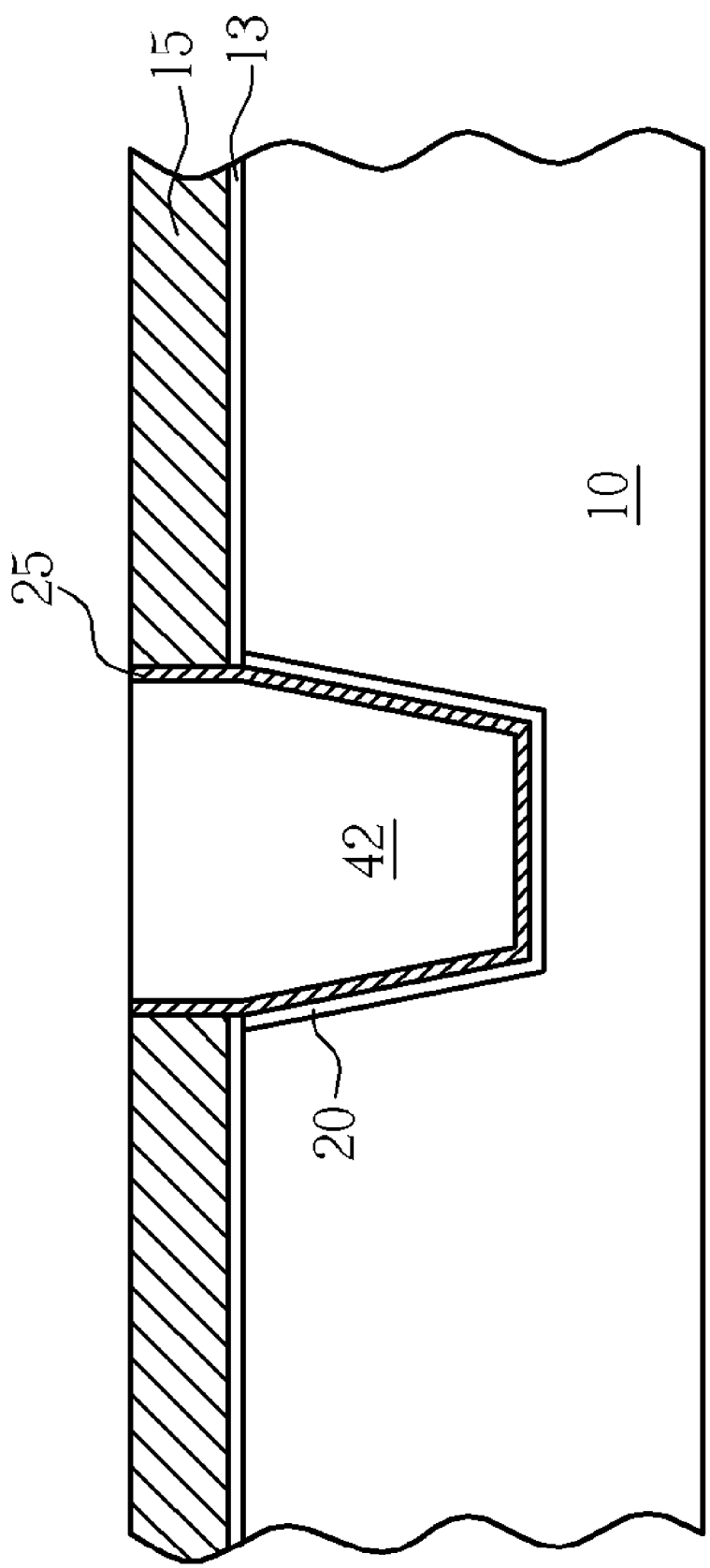
FIG. 7 is a partial vertical cross-sectional view of a semiconductor wafer having the HDPCVD oxide polished back to expose the pad nitride layer.
Figure 8:
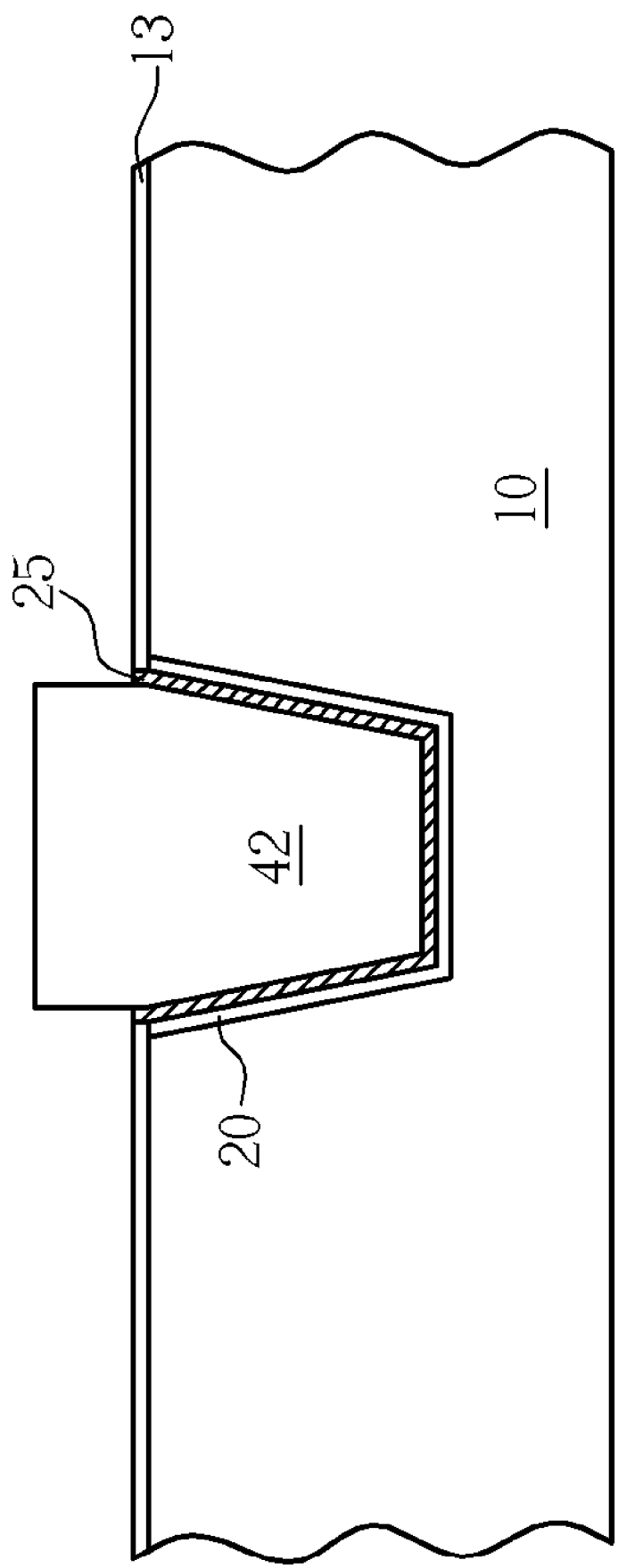
FIG. 8 is a partial vertical cross-sectional view of a semiconductor wafer having the pad nitride layer removed.

As shown in FIG. 7, using the pad nitride layer 15 as a polish stop layer, the excess trench fill dielectric 42 outside the trench 17 is then removed by conventional chemical mechanical polishing (CMP) methods. Finally, as shown in FIG. 8, the exposed pad nitride layer 15 is selectively removed using any suitable methods known in the art, for example, wet etching such as etching solutions containing hot phosphoric acid or the like, or dry etching.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A method of manufacturing trench isolation, comprising:
   providing a semiconductor substrate having a layer of pad oxide disposed thereon and a layer of pad nitride disposed directly on the pad oxide;
   etching at least one trench, through the pad oxide and the pad nitride, into the semiconductor substrate;
   growing a thermal oxide liner in the trench;
   depositing a silicon nitride liner into the trench, wherein the silicon nitride liner has a first stress status;
   performing a stress alteration process to alter the silicon nitride liner from the first stress status to a second stress status; and
   depositing a trench fill dielectric having the second stress status into the trench.

2. The method according to claim 1 wherein the first stress status is tensile stress.

3. The method according to claim 1 wherein the second stress status is compressive stress.

4. The method according to claim 1 wherein the silicon nitride liner has a thickness of about 20–100 angstroms.

5. The method according to claim 1 wherein the stress alteration process is a plasma treatment.

6. The method according to claim 5 wherein the plasma treatment comprises $H_2$ plasma, $O_2$ plasma, $N_2$ plasma, He plasma or $CO_2$ plasma treatment.

7. A method of eliminating void defects at the interface between a silicon nitride liner and a trench fill dielectric during the fabrication of trench isolation, comprising:
   providing a semiconductor substrate having a layer of pad oxide disposed thereon and a layer of pad nitride disposed directly on the pad oxide;
   etching an aperture into the pad oxide and the pad nitride;
   etching a trench through the aperture into the semiconductor substrate;
   growing a thermal oxide liner in the trench;
   depositing a silicon nitride liner into the trench, wherein the silicon nitride liner covering the pad nitride and the thermal oxide liner is tensile-stressed;
   performing a stress alteration process to alter the silicon nitride liner from tensile to compressive;
   depositing a compressive-stressed trench fill dielectric into the trench; and
   chemical mechanical polishing the compressive-stressed trench fill dielectric outside the trench to expose the pad nitride.

8. The method according to claim 7 wherein the silicon nitride liner has a thickness of about 20–100 angstroms.

9. The method according to claim 7 wherein the stress alteration process is a plasma treatment.

10. The method according to claim 9 wherein the plasma treatment comprises $H_2$ plasma, $O_2$ plasma, $N_2$ plasma, He plasma or $CO_2$ plasma treatment.

* * * * *